United States Patent
Schweighofer

[11] Patent Number: 6,150,880
[45] Date of Patent: Nov. 21, 2000

[54] METHOD AND DEVICE FOR GENERATING DRIVE SIGNALS FOR A POWER OUTPUT STAGE, AND A POWER OUTPUT STAGE

[75] Inventor: Peter Schweighofer, Nuernberg, Germany

[73] Assignee: Siemens Aktiengesellschaft, Munich, Germany

[21] Appl. No.: 09/371,984

[22] Filed: Aug. 11, 1999

[30] Foreign Application Priority Data

Aug. 18, 1998 [DE] Germany ............................ 198 37 439

[51] Int. Cl.⁷ ..................................................... H03F 21/00
[52] U.S. Cl. ...................................... 330/207 A; 330/251
[58] Field of Search ................................ 330/10, 207 A, 330/251

[56] References Cited

U.S. PATENT DOCUMENTS

| | | | |
|---|---|---|---|
| 4,554,512 | 11/1985 | Aiello | 330/10 |
| 5,111,378 | 5/1992 | Nowak et al. | |
| 5,546,299 | 8/1996 | Lenz | |
| 5,610,553 | 3/1997 | Kirn | 330/10 |
| 5,613,010 | 3/1997 | Heyl et al. | 381/117 |
| 5,631,605 | 5/1997 | Bailly | 330/146 |
| 5,982,231 | 11/1999 | Nalbant | 330/10 |
| 6,028,476 | 2/2000 | Schweighofer | 330/10 |
| 6,034,565 | 3/2000 | Schweighofer | 330/10 |

FOREIGN PATENT DOCUMENTS 2172458A  9/1986  United Kingdom .................... 330/251

Primary Examiner—Robert Pascal
Assistant Examiner—Henry Choe
Attorney, Agent, or Firm—Hill & Simpson

[57] ABSTRACT

In a method for generating respective drive signals for four switch elements of a power output stage, a start signal and a stop signal are generated depending on an on-duration value first and second changeover signals are generated for driving each of two switch elements depending on the start and stop signals; and the drive signals are generated depending on the first and second changeover signals. A drive device and a power output stage are operated according to this method.

11 Claims, 3 Drawing Sheets

METHOD AND DEVICE FOR GENERATING DRIVE SIGNALS FOR A POWER OUTPUT STAGE, AND A POWER OUTPUT STAGE

BACKGROUND OF THE INVENTION

1. Field of the Invention

The present invention relates to a method and a device for generating respective drive signals for four switch elements of a power output stage which are arranged in a bridge circuit, and relates as well as to a power output stage. In particular, the invention is provided for use in a power output stage which permits the generation of high output voltages and currents with high precision, such as an output stage of a gradient amplifier in a magnetic resonance tomography device, for example, or other fields, such as in devices for inductive heating.

1. Description of the Prior Art

A gradient amplifier in a magnetic resonance tomography device must provide voltages on the order of magnitude from several hundred volts to several thousand volts during a measurement procedure, in order to generate a precisely controlled current in a gradient coil. The current characteristic has maxima up to several hundred amps. The predetermined current flow must be precisely maintained to within a few mA.

To satisfy these high requirements, switched output stages are usually employed. German OS 40 24 160 discloses such an output stage of a gradient amplifier, wherein four switch elements are arranged in an H-bridge circuit. Pairs of these switch elements are connected in series and are connected to a supply voltage. A modulator generates a drive signal for each of the switch elements.

German OS 43 04 517 discloses a modulator for a gradient amplifier which generates respective drive signals for four switch elements that are arranged in a bridge circuit by comparing a manipulated variable to a triangular voltage.

In terms of circuitry, modulators such as described in German OS 40 24 160 and German OS 43 04 517 have a high outlay. An analog circuit which generates the required drive signals requires elements with tight tolerances and a large printed circuit board area. Moreover, an expensive calibration is necessary in connection with production and maintenance (servicing). This is true particularly with respect to the generation and maintenance of dead times in the alternating of switches within a bridge circuit.

SUMMARY OF THE INVENTION

Accordingly, it is the object of the present invention to provide a method and a device for generating drive signals for a power output stage, and a power output stage, both of which satisfy high power and quality demands given optimally low production and maintenance outlay.

The above object is achieved in accordance with the principles of the present invention in a power amplifier and in a drive device for a power amplifier, and in a method for operating a drive device in a power amplifier, wherein the power output stage has four switch elements arranged in a bridge circuit, the bridge circuit having a first bridge branch wherein two of the switch elements are connected in series and a second bridge branch in which the other two of the switch elements are connected in series, and wherein a start signal and a stop signal for a voltage pulse of an output voltage of the power output stage are generated dependent on an on-duration value, first and second changeover signals are generated for driving each of the bridge branches dependent on the start signal and the stop signal, wherein drive signals for the switch elements in the first bridge branch are generated dependent on the first changeover signal, and wherein drive signals for the switch elements of the second bridge branch are generated dependent on the second changeover signal.

As used herein a "signal" is any means for communicating between and within components of a circuit or of a program.

The invention is based on the basic concept of modularizing the overall generation of the drive signals and dividing the signal generator into individual function groups such that a particularly low wiring outlay arises for these function groups and for the communication paths running between the function groups. A particularly simple circuit structure is thereby achieved, particularly in digital circuitry as well.

The invention is preferably implemented in digital circuitry, for example by means of a programmable digital module and/or a digital processor and/or a hard-wired digital circuit. This, however, does not preclude individual analog components. The circuit is economic, precise and flexible. Calibration tasks are not necessary. The dead time for preventing a bridge short also can be generated digitally, which involves much less outlay than a conventional analog circuit.

In preferred embodiments of the invention, all processes are synchronized with a common clock. In particular, all signal edges substantially coincide with the clock pulse. This time-slice-dependent functioning simplifies matching a fully digital drive with the power output stage and/or the gradient amplifier.

Preferably, the beginning and the end of each voltage pulse of the output voltage is determined by an active start signal, or stop signal, respectively. In this context, "substantially" means that a dead time (if it exists) in the changeover within a bridge branch should not be taken into account. The changeover signals preferably trigger a change in the switch status of the two switch elements of the respective bridge branches. During this change, a dead time is preferably maintained, while the two switch elements of the bridge branch are in a blocking (non-conducting) state.

A drive method is preferably inventively implemented in digital form which is similar to that disclosed in German OS 40 24 160 in the context of an analog drive circuit. With reference to this drive method, the contents of German OS 40 24 160 are incorporated herein by reference.

DESCRIPTION OF THE PREFERRED EMBODIMENTS

Figure 1:
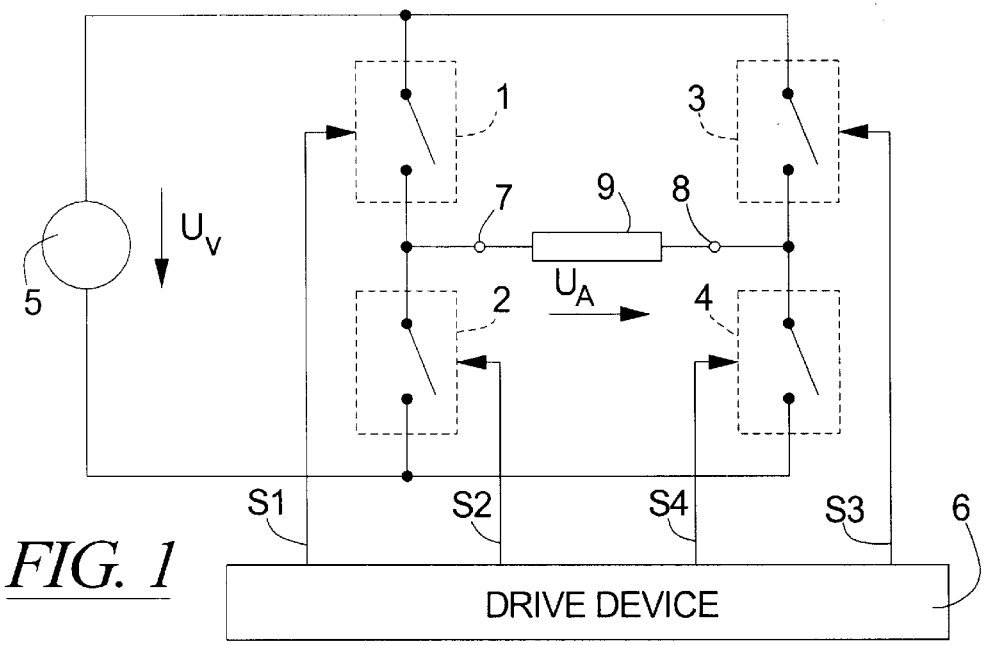
FIG. 1 is a block diagram of a power output stage that is connected to a load.

The power output stage of a gradient amplifier in a magnetic resonance tomography device has four switch elements 1,2,3,4 which are arranged in a bridge circuit. A first bridge branch is formed by the two series connected switch elements 1,2, and a second bridge branch has the two switch elements 3,4, which are likewise connected in series. The two bridge branches are connected in parallel to a voltage source 5, which makes available a supply voltage $U_v$. The four switch elements 1,2,3,4, which can be fashioned as field effect transistors, for example, are supplied by a common drive device 6 with drive signals S1, S2, S3, S4.

An output terminal 7 is connected to the switch elements 1,2, and an output terminal 8 is connected to the switch elements 3,4 of the two bridge branches. An output voltage $U_A$ of the power output stage is across the output terminals 7,8. A load 9 in the form of a gradient coil is connected to the output terminals 7,8 and is thus connected in the bridge circuit.

Figure 2:
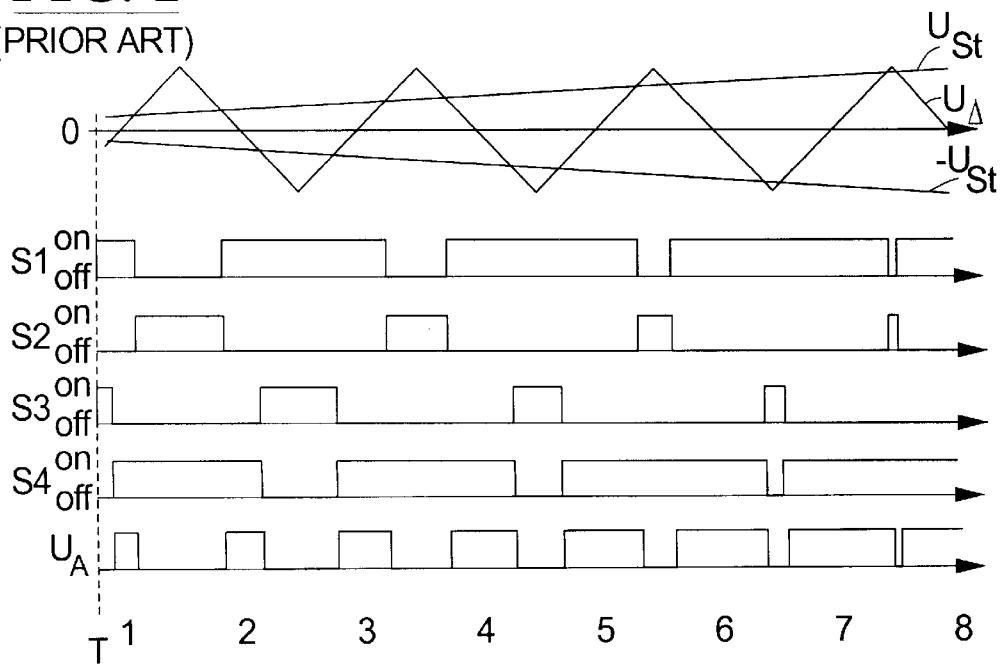
FIG. 2 shows signal characteristics in a power output stage according to the prior art.
Figure 3:
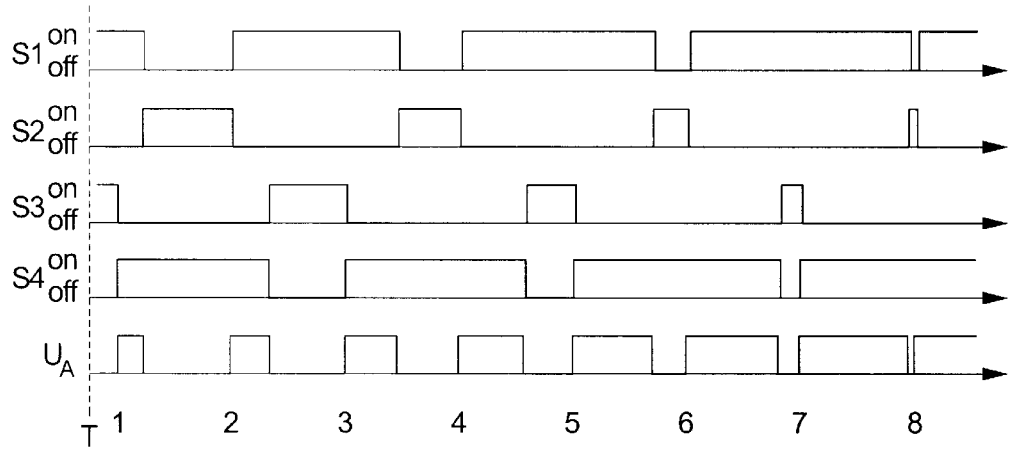
FIG. 3 shows signal characteristics in an inventive power output stage.

FIGS. 2 and 3 respectively exemplarily depict signal characteristics of the drive signals S1, S2, S3, S4 as well as the resulting output voltage $U_A$ given a gradually rising control factor of the power output stage. In the illustrated time segment, a total of eight output voltage impulses are generated according to the principle of pulsewidth modulation (PWM) for the clock times T=1 to T=8, whereby the pulsewidth of the output voltage $U_A$ increasing in proportion to the control factor. The cycle time, i.e. the time period between each two consecutive clock instants T, can equal 10 ms, for example.

The signal characteristics illustrated in FIG. 2 and FIG. 3 correspond to a PWM drive technique as is taught in German OS 40 24 160. In this method, for each direction of the load current, two switch elements 1,4, or 3,2 which are situated diagonally across from one another in the bridge circuit, are respectively periodically cycled, with the output voltage impulses being determined by the overlap of the activation times of these switch elements 1,4, or 3,2. In addition, the two other switch elements 2,3, or 4,1 are cycled in counterphase. The illustration in FIG. 2 and FIG. 3 is schematic to the extent that the dead times between the activation phases of the two respective series-connected switch elements 1,2, or 3,4 are not taken into account.

The drive signals S1–S4 in FIG. 2 are generated by an analog modulator that is known, as described in German OS 43 04 517, for example. The modulator is driven by a control output voltage $U_{st}$, which is proportional to the desired pulsewidth of the output voltage $U_A$. The modulator has analog comparators for comparing the control output voltage $U_{st}$ and a negative control output voltage $-U_{st}$ to a triangular voltage $U_A$. The triangular voltage $U_A$ is synchronized with the system clock, so that a zero crossing of the triangular voltage $U_A$ takes place at every clock time T. The intersection of the triangular voltage $U_A$ and the control output voltages $U_{st}$ and $-U_{st}$ determine (omitting the dead times) the change of the switch status of the switch elements 1–4, i.e. the edges of the drive signals S1–S4.

The signals depicted in FIG. 3 are generated by an inventive drive device 6. The drive signals S1–S4 and the output voltage curve $U_A$ are essentially identical with that shown in FIG. 2. The inventive drive device 6 is thus an effective substitute for the known modulator in analog circuit technology. The primary difference compared to FIG. 2 is that each edge of each pulse in FIG. 3 is synchronized with a respective clock time T. This simplifies a fully synchronous operation of the individual modules of the drive device 6, and other components of the power amplifier.

Figure 4:
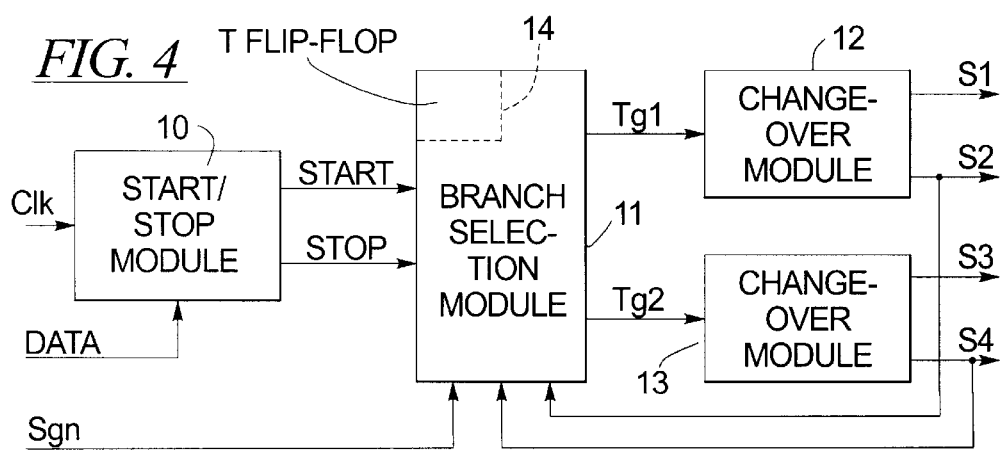
FIG. 4 is a block diagram of an inventive drive device.

FIG. 4 depicts the drive device 6 in a functional block diagram. A start/stop module 10 receives a clock signal Clk and an on-duration value Data. The star/stop module 10 generates a start signal Start and a stop signal Stop from these inputs. These two signals as well as an operational sign signal Sgn and two drive signals (S2 and S4 here) which indicate the current switch status are processed by a branch selection module 11, in order to generate two changeover signals Tg1, Tg2. A first changeover module 12 receives the first changeover signal Tg1 and generates the two drive signals S1 and S2 therefrom, and the drive signals S3 and S4 are derived from the second changeover signal Tg2 by a second changeover module 13.

In the operation of the circuit according to FIG. 4, the frequency of the clock signal Clk corresponds to the clock time T, equaling 100 kHz, for example. The on-duration value Data indicates the desired pulse period of the output voltage $U_A$, for instance as a binary data word. At the clock time T that is indicated by the clock signal Clk, the start/stop module 10 reads in the on-duration value Data and simultaneously outputs an active start signal Start (e.g. a start pulse). After the end of the period of the output voltage pulse, which period is determined by the on-duration value Data, the start/stop module 10 generates an active stop signal Stop (e.g. a stop impulse). In alternative embodiments, the start signal Start is activated with a delay that is reciprocal to the on-duration value, so that it is always possible to generate the stop signal Stop at the end of a time slice (synchronously with a clock time T). The result is a time behavior which mirrors the illustration in FIG. 3.

In the exemplary embodiment described herein, the start/stop module 10 is a counter which is driven with a rapid counting cycle of, for instance, 32 MHz and thus makes available a high time resolution of the pulse period between the start signal and the stop signal. The counter can be a reverse counter which is loaded with the on-duration value Data and which generates the stop signal Stop upon attainment of the counter status "zero". As an alternative, a forward counter can be used, whose counter status is compared to the on-duration value Data. The on-duration value Data can be coded as a binary number or as a complement of a binary number, or in some other way. In general, the value range of the on-duration value Data can be selected such that the maximum on-duration is longer than the interval between two clock times T. It is thus possible to realize transitions from one time slice to the next without switch alternation.

In the drive method described herein, one bridge branch changes state at the beginning of each output voltage pulse, and the other bridge branch changes state at the end of the pulse ("toggle"). The branch selection module 11 specifies the allocation to the first and second bridge branches (switch elements 1,2, or 3,4) by selectively activating the first and/or the second changeover signal Tg1, Tg2.

In response to a start impulse (active start signal Start), the branch selection module 11 generates a changeover pulse of the first and/or second changeover signal Tg1, Tg2 according to the truth table below. The operational sign signal Sgn indicates whether a positive (Sgn=0) or a negative (Sgn=1) output voltage $U_A$ should be generated. Furthermore, the reaction of the branch selection module 11 also depends on the present switch status of the bridge circuit, which is represented here by the drive signals S2 and S4.

| Sgn | S2 | S4 | Tg1 | Tg2 | Note |
|---|---|---|---|---|---|
| 0 | 0 | 0 | 0 | 1 | turn on |
| 0 | 0 | 1 | 0 | 0 | continue running |
| 0 | 1 | 0 | 1 | 1 | error |
| 0 | 1 | 1 | 1 | 0 | turn on |
| 1 | 0 | 0 | 1 | 0 | turn on |
| 1 | 0 | 1 | 1 | 1 | error |
| 1 | 1 | 0 | 0 | 0 | continue |
| 1 | 1 | 1 | 0 | 1 | turn on |

In the above table, the cases referenced "error" refer to a direct transition between positive and negative output voltage $U_A$. Given normal driving, this situation does not arise, however, this type of operation is possible in alternative embodiments, wherein the switch elements 1–4 are more intensely loaded.

In response to an active stop signal Stop, an unbiased phase is triggered (low-resistivity connection of the two output terminals 7,8 via the switch bridge). During the unbiased phase, either the switch elements 1,3 or the switch elements 2,4 conduct the load current. The unbiased path is changed over in each output voltage pulse. To this end, the branch selection module 11 has a toggle (T-type) flip-flop 14, whose switch status determines whether an upper (switch elements 1 and 3 conduct) or a lower (switch elements 2 and 4 conduct) freewheel operation should occur.

The table below depicts the truth table that is implemented by the branch selection module 11 in response to a stop pulse (active stop signal Stop). The changeover signals Tg1, Tg2 and the successor state FL' of the toggle flip-flop 14 depend on the current state FL of the toggle flip-flop 14 and on the momentary switch us of the bridge.

| FL | S2 | S4 | Tg1 | Tg2 | FL' | Note |
|---|---|---|---|---|---|---|
| 0 | 0 | 0 | 0 | 0 | 1 | already unbiased |
| 0 | 0 | 1 | 0 | 1 | 1 | turn off |
| 0 | 1 | 0 | 0 | 1 | 1 | turn off |
| 0 | 1 | 1 | 0 | 0 | 1 | already unbiased |
| 1 | 0 | 0 | 0 | 0 | 0 | already unbiased |
| 1 | 0 | 1 | 1 | 0 | 0 | turn off |
| 1 | 1 | 0 | 1 | 0 | 0 | turn off |
| 1 | 1 | 1 | 0 | 0 | 0 | already unbiased | alternative embodiments, the toggle diode flip-flop 14 can be constructed as a storage element which is operated under the control of the branch module 11. In complex gradient amplifiers having a number of drive devices 6, a single flip flop 14 can be shared in order to obtain a coordinated behavior of the drive devices 6. In other embodiment alternatives, a predetermined constant switch status is utilized in the unbiased mode. The flip-flop 14 can then be omitted entirely.

In the exemplary embodiment described herein, the branch selection module 11 is constructed as a fixed-program memory in which the two truth tables above are contained. These tables can be merged into a single truth table. In alternative embodiments, the branch module 11 is a logic circuit or a program module.

The first changeover module 12 generates the two drive signals S1, S2 for the first bridge branch from the first changeover signal Tg1. The function of the first changeover module 12 corresponds to that of a flip-flop. In addition, it is guaranteed that at the most one of the switch elements 1,2 is conducting at all times, and that suitable dead times between the conductive phases of the switch elements 1,2 are maintained, in order to prevent a bridge short. The first changeover module 12 can be constructed as a logic circuit and can include a flip-flop and a suitable dead time counter (with a width of 4 to 8 bits, for example).

Figure 5:
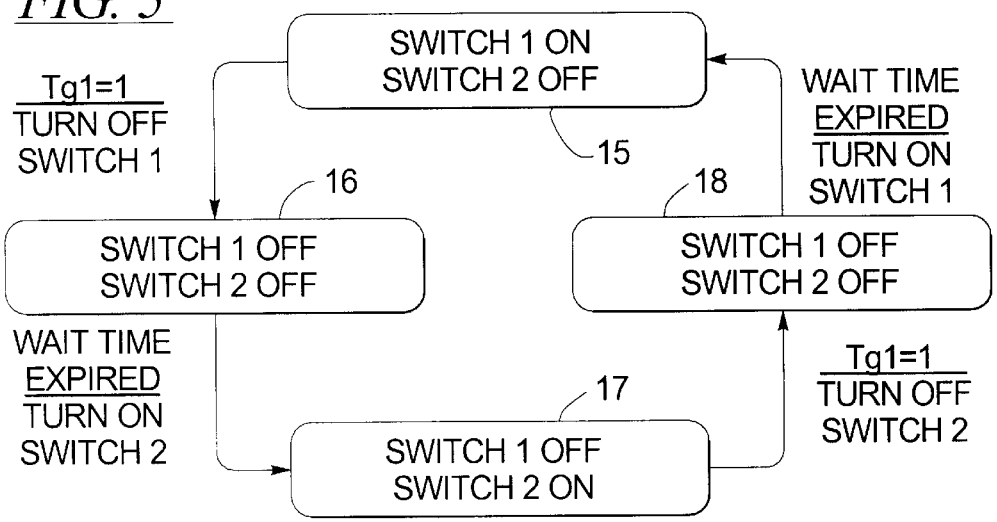
FIG. 5 is a status/transition diagram of a changeover module for use in the inventive drive device.

FIG. 5 depicts the state/transition diagram that is associated with the first changeover module 12. In a first state 15, such as is present at the clock time T=1 in FIG. 3, for example, the switch element 1 conducts, and the switch element 2 blocks. Given the occurrence of a changeover pulse (active first changeover signal Tg1), the switch element 1 is turned off, and a transition into a second state 16 occurs. The state 16 is maintained during a dead time which is determined by the first changeover module 12. Subsequent to the wait time, the switch element 2 is shifted into a conductive state, in order to achieve a third state 17. The alternation into a fourth state 18 is triggered by an additional changeover impulse (Tg1=1), and the first state 15 is achieved again at the end of the dead time.

The second changeover module 13 is identical to the first changeover module 12, however, the second changeover module 13 receives the second changeover signal Tg2 and generates the two drive signals S3, S4 for the two switch elements 3,4 of the second bridge branch. The state/transition diagram that is valid for the second changeover module 13 corresponds to that depicted in FIG. 5, with the modifications that result from the different circuit connections.

Altogether, the drive signals S1–S4 are generated as in FIG. 3 by the described drive circuit 6. The exemplary illustration of FIG. 3 is based on a positive output voltage $U_A$ (Sgn=0). The flip-flop 14 has a state FL=1 initially. With each trailing edge of the output voltage $U_A$, this state changes; for example, in the time interval between T=1 and T=2 a change to FL=0 occurs. The transition from the first state 15 to the second state 16 in FIG. 5 likewise occurs in this time interval (between T=1 and T=2), and the transition from the fourth state 18 back to the first state 15 occurs at the clock time T=2.

Figure 6:
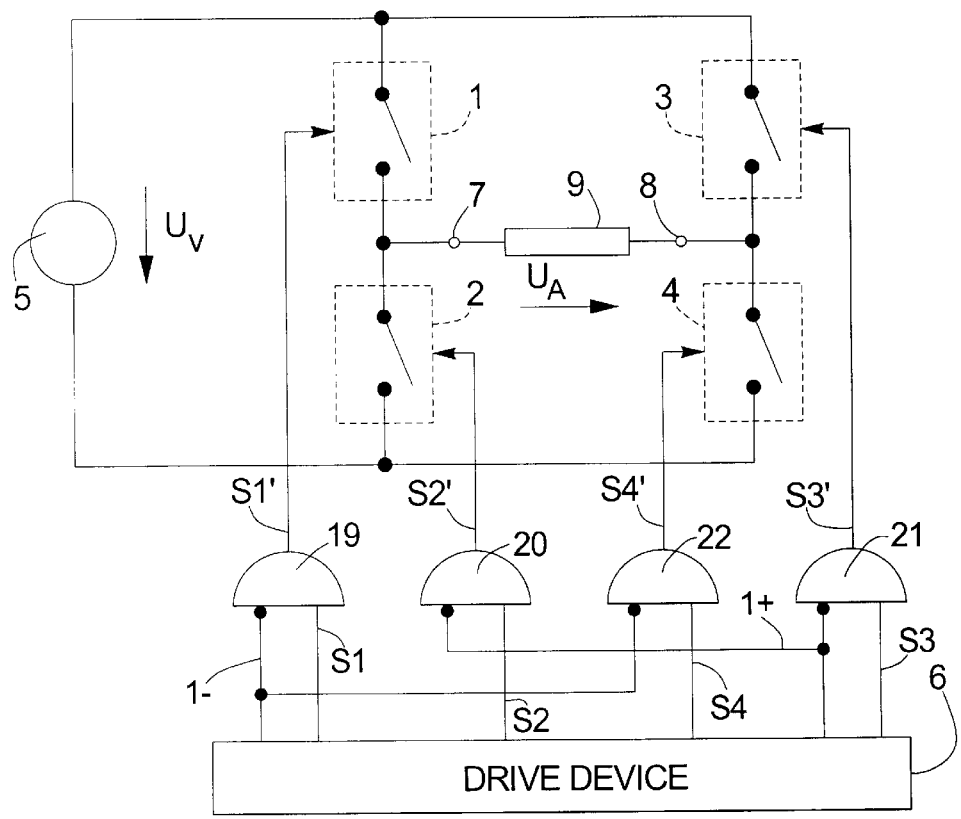
FIG. 6 is a block diagram of an alternative embodiment of the power output stage of FIG. 1.

In the alternative embodiment of the power output stage depicted in FIG. 6, the switch elements 1–4 are constructed as IGBTs (IGBT=insulated gate bipolar transistor) with integrated unbiased diodes. It is desirable here not to actuate the switch elements 1–4 given a current flow through the respective unbiased diodes, in order to reduce the switch delay time in the next switching process. This is achieved by four AND gates 19,20,21,22. Each drive signal S1–S4 is applied at each non-inverting input of the AND gates 19–22. A current direction signal I+ which is generated by the drive device 6 and which indicates a positive current flow through the load 9 is at the inverting inputs of the AND gates 20,21. A current direction signal I– indicating a negative current flow through the load 9 is connected to the inverting inputs of the AND gates 19,22. The AND gates 19–22 generate modified drive signals S1'–S4' for driving the IGBTs 1–4.

In various embodiments of the invention, the circuit according to FIG. 4 is generally constructed as a digital circuit. For example, conventional modules such as counters, registers, gates, etc. can be used. Programmable digital modules are preferably utilized to make available individual functions or all functions of the drive device 6. This type of programmable digital module can be an EPLD module (EPLD=electrically programmable logic device), for example. A partial or complete implementation of the drive device 6 by means of a suitably programmed processor, particularly a digital signal processor, can also be undertaken. The individual modules described above can be program modules of the program executed by this processor. In particular, in this connection, the term "signal" means not only a quantity which varies over time, but also any communication means in the program execution, such as interrupts, data values in commonly accessible memory areas, operating system signals, or data which are transmitted by means of a parameter transfer or a process communication mechanism.

Although modifications and changes may be suggested by those skilled in the art, it is the intention of the inventor to embody within the patent warranted hereon all changes and modifications as reasonably and properly come within the scope of his contribution to the art.

I claim as my invention:

1. In an amplifier power output stage containing first, second, third and fourth switch elements arranged in a bridge circuit connected across a voltage source, said bridge circuit having a first bridge branch in which said first and second switch elements are connected in series and a second bridge branch in which said third and fourth switch elements are connected in series, a method for generating respective drive signals for said first, second, third and fourth switch elements comprising the steps of:

generating a start signal and a stop signal for a voltage pulse of an output voltage of said output stage dependent on an on-duration value;

generating a first changeover signal and a second changeover signal dependent on said start signal and said stop signal;

generating respective drive signals for said first and second switch elements dependent on said first changeover signal; and generating respective drive signals for said third and fourth switch elements dependent on said second changeover signal.

2. A method as claimed in claim 1 comprising generating said drive signals for said first and second switch elements and generating said drive signals for said third and fourth switch elements in a digital circuit.

3. A method as claimed in claim 1 comprising generating said start signal to indicate a beginning of said voltage pulse and generating said stop signal to indicate an end of said voltage pulse.

4. A method as claimed in claim 1 comprising triggering a change of state of the drive signals for said first and second switch elements by said first changeover signal and triggering a change of state of the drive signals for said third and fourth switch elements by said second changeover signal.

5. A method as claimed in claim 4 wherein each change of state of said drive signals for said first and second switch elements has a first bridge branch dead time associated therewith, and wherein each change of state of said drive signals for said third and fourth switch elements has a second bridge branch dead time associated therewith, and said method comprising the additional steps of inactivating said drive signals for said first and second switch elements during said first bridge branch dead time and inactivating said drive signals for said third and fourth switch elements during said second bridge branch dead time.

6. A method as claimed in claim 1 wherein said first switch element and said fourth switch element are disposed diagonally relative to each other in said bridge circuit, forming a first diagonal pair and wherein said second switch element and said third switch element are disposed diagonally relative to each other in said bridge circuit, forming a second diagonal pair, and wherein said output voltage has first and second opposite polarities, and comprising the step of, for each of said polarities of said output voltage, supplying the respective drive signals for the switch elements in said first diagonal pair with an overlapping time to generate said voltage pulse of said output voltage, and supplying the respective drive signals for said switch elements in said second diagonal pair in counter-phase to the drive signals for the switch elements in said first diagonal pair.

7. A drive circuit for use with an amplifier power output stage containing first, second, third and fourth switch elements arranged in a bridge circuit connected across a voltage source, said bridge circuit having a first bridge branch in which said first and second switch elements are connected in series and a second bridge branch in which said third and fourth switch elements are connected in series, said drive circuit generating respective drive signals for said first, second, third and fourth switch elements and comprising:

a start/stop module for generating a start signal and a stop signal for a voltage pulse of an output voltage of said output stage dependent on an on-duration value;

a branch selection module for generating a first changeover signal and a second changeover signal dependent on said start signal and said stop signal;

a first changeover module for generating respective drive signals for said first and second switch elements dependent on said first changeover signal; and a second changeover module for generating respective drive signals for said third and fourth switch elements dependent on said second changeover signal.

8. A drive device as claimed in claim 7 wherein said star/stop module, said branch selection module, said first changeover module and said second changeover module comprise a digital circuit.

9. A drive device as claimed in claim 8 wherein said digital circuit comprises a programmable digital module.

10. A drive device as claimed in claim 8 wherein said digital circuit comprises a digital processor.

11. An amplifier power output stage comprising:

a voltage source;

first, second, third and fourth switch elements arranged in a bridge circuit connected across said voltage source, said bridge circuit having a first bridge branch in which said first and second switch elements are connected in series and a second bridge branch in which said third and fourth switch elements are connected in series; and a drive circuit for generating respective drive signals for said first, second, third and fourth switch elements comprising a start/stop module for generating a start signal and a stop signal for a voltage pulse of an output voltage of said output stage dependent on an on-duration value, a branch selection module for generating a first changeover signal and a second changeover signal dependent on said start signal and said stop signal, a first changeover module for generating respective drive signals for said first and second switch elements dependent on said first changeover signal, and a second changeover module for generating respective drive signals for said third and fourth switch elements dependent on said second changeover signal.

* * * * *